(12) United States Patent
Silverbrook

(10) Patent No.: US 7,465,405 B2
(45) Date of Patent: Dec. 16, 2008

(54) METHOD OF FABRICATING PRINTHEADS HAVING MULTIPLE NOZZLE ASSEMBLIES

(75) Inventor: Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 254 days.

(21) Appl. No.: 11/450,431

(22) Filed: Jun. 12, 2006

(65) Prior Publication Data

US 2006/0261423 A1 Nov. 23, 2006

Related U.S. Application Data

(63) Continuation of application No. 10/296,660, filed as application No. PCT/AU00/00583 on May 24, 2000, now Pat. No. 7,063,993.

(51) Int. Cl.
*G01D 15/00* (2006.01)
(52) U.S. Cl. .............................. 216/27; 216/34; 216/95; 347/29

(58) Field of Classification Search ................... 216/27, 216/34, 95; 347/6, 29
See application file for complete search history.

(56) References Cited

U.S. PATENT DOCUMENTS

| | | | |
|---|---|---|---|
| 5,000,811 A * | 3/1991 | Campanelli | 156/264 |
| 5,273,615 A | 12/1993 | Asetta et al. | |
| 5,476,566 A | 12/1995 | Cavasin | |
| 5,605,489 A | 2/1997 | Gale et al. | |
| 5,882,532 A | 3/1999 | Field et al. | |
| 5,900,892 A * | 5/1999 | Mantell et al. | 347/45 |
| 5,923,995 A | 7/1999 | Kao et al. | |
| 6,060,336 A | 5/2000 | Wan | |
| 6,159,385 A | 12/2000 | Yao et al. | |
| 6,176,966 B1 | 1/2001 | Tsujimoto et al. | |

FOREIGN PATENT DOCUMENTS

| | | |
|---|---|---|
| CA | 2119505 | 9/1994 |
| DE | 4223215 A1 | 1/1994 |
| EP | 359373 A2 | 3/1990 |
| JP | 11204551 A | 7/1999 |

\* cited by examiner

*Primary Examiner*—Lan Vinh

(57) ABSTRACT

A method of fabricating printheads each having a plurality of nozzle assemblies positioned on a substrate from a plurality of sets of the nozzle assemblies positioned on the substrate includes the step of applying a guard defining a plurality of recesses to the substrate so that each set is located within a respective recess. The substrate is then segmented.

5 Claims, 3 Drawing Sheets

METHOD OF FABRICATING PRINTHEADS HAVING MULTIPLE NOZZLE ASSEMBLIES

CROSS REFERENCE TO RELATED APPLICATIONS

This application a continuation application of U.S. application Ser. No. 10/296,660 filed on Aug. 1, 2003 now U.S. Pat. No. 7,063,993, which is a national phase (371) application of PCT/AU00/00583, filed on May 24, 2000, all of which are herein incorporated by reference.

FIELD OF THE INVENTION

This invention relates to the fabrication of devices incorporating microelectromechanical systems (MEMS). More particularly, the invention relates to a method of fabricating a MEMS device using at least one UV curable tape. For the sake of brevity, such a device shall be referred to below as a MEMS device and the part of the device comprising the microelectromechanical system shall be referred to as a MEMS layer.

CO-PENDING APPLICATIONS

Various methods, systems and apparatus relating to the present invention are disclosed in the following co-pending applications filed by the applicant or assignee of the present invention simultaneously with the present application:

PCT/AU00/00518, PCT/AU00/00519, PCT/AU00/00520, PCT/AU00/00521, PCT/AU00/00522, PCT/AU00/00523, PCT/AU00/00524, PCT/AU00/00525, PCT/AU00/00526, PCT/AU00/00527, PCT/AU00/00528, PCT/AU00/00529, PCT/AU00/00530, PCT/AU00/00531, PCT/AU00/00532, PCT/AU00/00533, PCT/AU00/00534, PCT/AU00/00535, PCT/AU00/00536, PCT/AU00/00537, PCT/AU00/00538, PCT/AU00/00539, PCT/AU00/00540, PCT/AU00/00541, PCT/AU00/00542, PCT/AU00/00543, PCT/AU00/00544, PCT/AU00/00545, PCT/AU00/00547, PCT/AU00/00546, PCT/AU00/00554, PCT/AU00/00556, PCT/AU00/00557, PCT/AU00/00558, PCT/AU00/00559, PCT/AU00/00560, PCT/AU00/00561, PCT/AU00/00562, PCT/AU00/00563, PCT/AU00/00564, PCT/AU00/00565, PCT/AU00/00566, PCT/AU00/00567, PCT/AU00/00568, PCT/AU00/00569, PCT/AU00/00570, PCT/AU00/00571, PCT/AU00/00572, PCT/AU00/00573, PCT/AU00/00574, PCT/AU00/00575, PCT/AU00/00576, PCT/AU00/00577, PCT/AU00/00578, PCT/AU00/00579, PCT/AU00/00581, PCT/AU00/00580, PCT/AU00/00582, PCT/AU00/00587, PCT/AU00/00588, PCT/AU00/00589, PCT/AU00/00583, PCT/AU00/00593, PCT/AU00/00590, PCT/AU00/00591, PCT/AU00/00592, PCT/AU00/00584, PCT/AU00/00585, PCT/AU00/00586, PCT/AU00/00594, PCT/AU00/00595, PCT/AU00/00596, PCT/AU00/00597, PCT/AU00/00598, PCT/AU00/00516, PCT/AU00/00517, PCT/AU00/00511, PCT/AU00/00501, PCT/AU00/00502, PCT/AU00/00503, PCT/AU00/00504, PCT/AU00/00505, PCT/AU00/00506, PCT/AU00/00507, PCT/AU00/00508, PCT/AU00/00509, PCT/AU00/00510, PCT/AU00/00512, PCT/AU00/00513, PCT/AU00/00514, PCT/AU00/00515

The disclosures of these co-pending applications are incorporated herein by cross-reference.

SUMMARY OF THE INVENTION

According to the present invention there is provided a method of fabricating MEMS devices, the method including the steps of:

providing a substrate and a MEMS layer, the MEMS layer arranged on one side of the substrate;

applying a further layer arranged to protect the MEMS layer to said one side of the substrate;

separating the substrate into discrete parts by performing at least one operation including a back etching operation from a side of the substrate opposed to the side having the MEMS layer, each discrete part carrying at least one MEMS part of the MEMS layer;

subsequent to the step of separating the substrate into discrete parts, applying a holding means to said opposed side of the substrate;

defining individual chips by performing at least one operation, including an etching operation on the further layer, each of said chips being composed of one of said discrete parts of the substrate, at least one part of the MEMS layer and a part of the further layer; and causing the individual chips to be released from the holding means for removal from the holding means.

Preferably the step of defining individual chips is performed after the step of applying a holding means to the substrate.

The method may further include the step of bonding the holding means to the substrate.

In a preferred embodiment the holding means is bonded to the substrate by means of an adhesive which is curable by exposure to ultraviolet (UV) light and in which the method further includes the step of exposing localized regions of the holding means to UV light to release one chip at a time from the holding means to enable each chip to be removed individually from the holding means.

Preferably the method further includes the step of applying a handling means to the holding means, the handling means being transparent to UV light so that UV light is transmitted through the handling means to cure the adhesive of the holding means.

It is advantageous if the method includes the step of removing each chip from the holding means by a transporting means.

The step of removing each chip from the holding means may include reciprocating each chip individually over a source of UV light.

The holding means may be bonded to the layer by means of an adhesive which is curable by exposure to ultraviolet (UV) light. By "curable" is meant that the adhesive loses its adhesive properties when exposed to UV light. Thus, the method may include exposing localised regions of the holding means to UV light to release one chip at a time from the holding means to enable each chip to be removed individually from the holding means. It will be appreciated that the handling means is transparent to UV light so that UV light is transmitted through the handling means to cure the adhesive of the holding means.

The handling means may be in the form of a glass, quartz, alumina or equivalent wafer.

The method may finally include removing each chip from the holding means by a transporting means.

BRIEF DESCRIPTION OF THE DRAWINGS

The invention is now described by way of example with reference to the accompanying diagrammatic drawings in which.

DETAILED DESCRIPTION OF THE INVENTION

Figure 1:
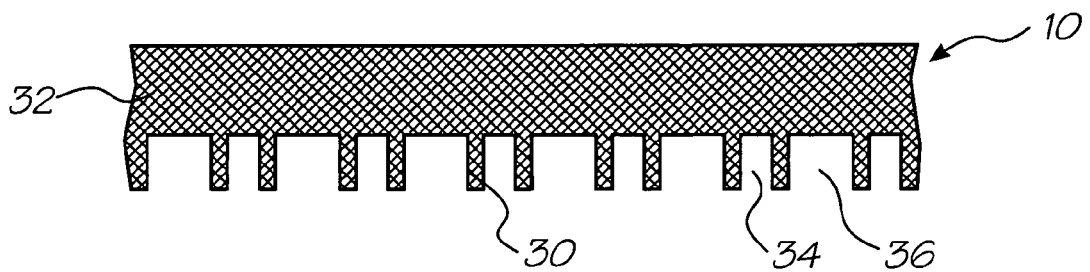
FIGS. 1 to 8 show various stages in a method of fabricating MEMS devices, in accordance with the invention.
Figure 2:
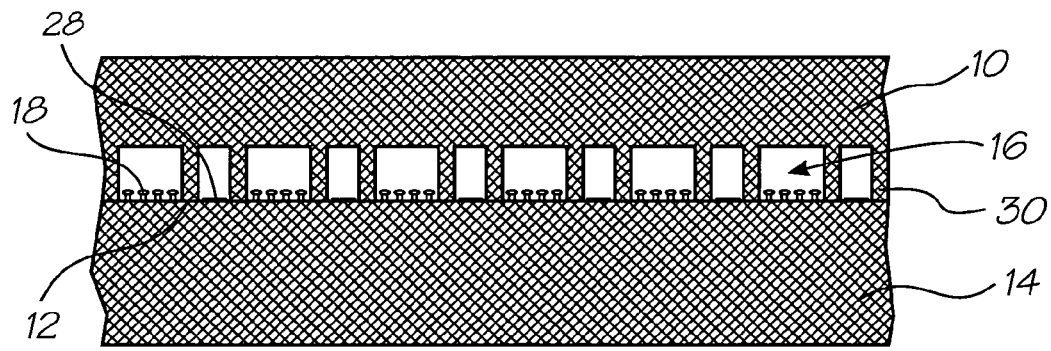

In an initial step, illustrated at 10 in FIG. 1 of the drawings, of a method of fabricating a MEMS device, in accordance with the invention, a layer 10 is provided to be applied to a first surface 12 of a silicon substrate or wafer 14.

The wafer 14 carries a surface macromachined MEMS layer 16 on the first surface 12 of the wafer 14. The MEMS layer 16 comprises individual MEMS elements 18.

The invention has particular application in the manufacture of ink jet printheads. For ease of explanation, the invention will be described with reference to that application. Thus, the layer 10 is a nozzle guard layer or wafer which is applied to the surface 12 of the silicon substrate 14. Each individual MEMS element 18 is in the form of a nozzle assembly. Each nozzle assembly 18 comprises an ink ejection nozzle and its associated actuator. The actuator acts on the nozzle for effecting ink ejection, on demand.

Figure 8:
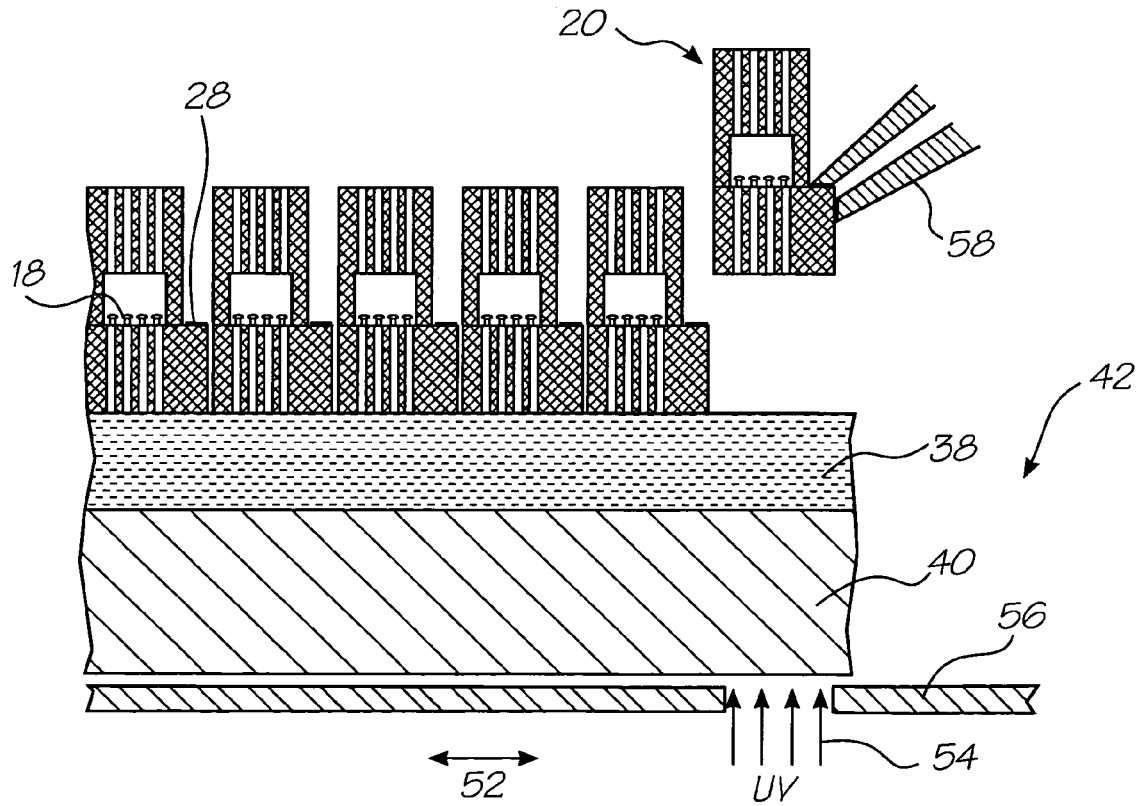

The purpose of the method of manufacture is to form individual MEMS chips 20 (FIG. 8).

Figure 3:
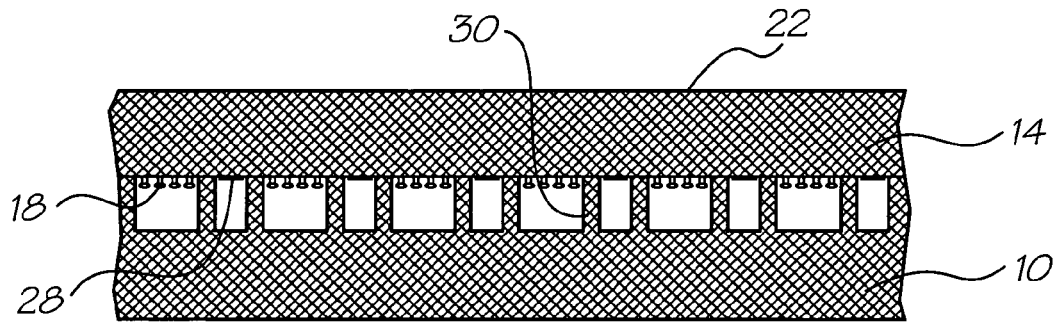
Figure 4:
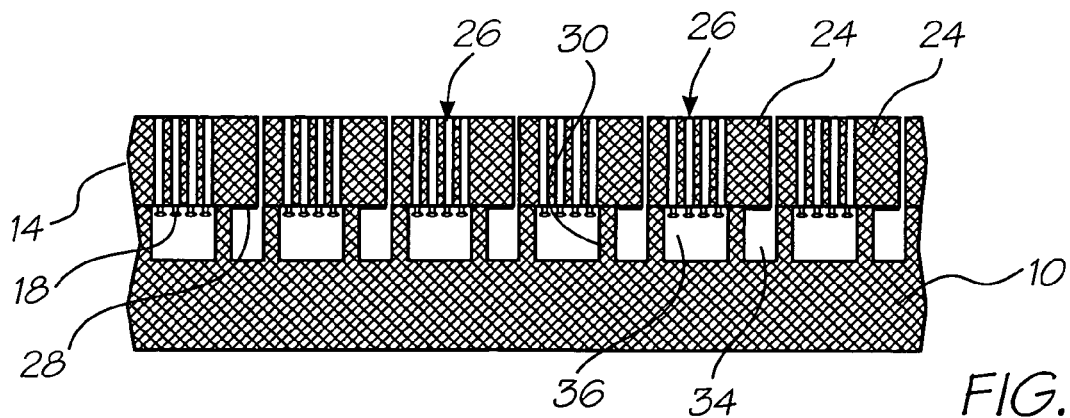

Hence, after the nozzle guard layer 10 has been applied to the wafer 14, the wafer 14 is turned over to expose a reverse side 22 as shown in FIG. 3 of the drawings.

Various operations are then carried out on the wafer 14. In particular, the wafer 14 is back etched, from the surface 22 towards the surface 12 to separate the silicon wafer into discrete parts 24. In addition, in this application of the invention, ink inlet apertures 26 are etched through the parts 24. It is to be noted that each part 24 comprises a plurality of MEMS elements 18 and a bond pad 28. Also, as shown more clearly in FIG. 1 of the drawings, the layer 10 has a plurality of struts 30 which support a body 32 of the layer 10 in spaced relationship above the surface 12 of the wafer 14 such that the MEMS elements 18 and the bond pads 28 are protected by the body 32. The struts 30 define chambers 34 and 36. The chambers 34 overlie the bond pads 28 while the chambers 36 overlie the array of MEMS elements 18 of each part 24.

Figure 5:
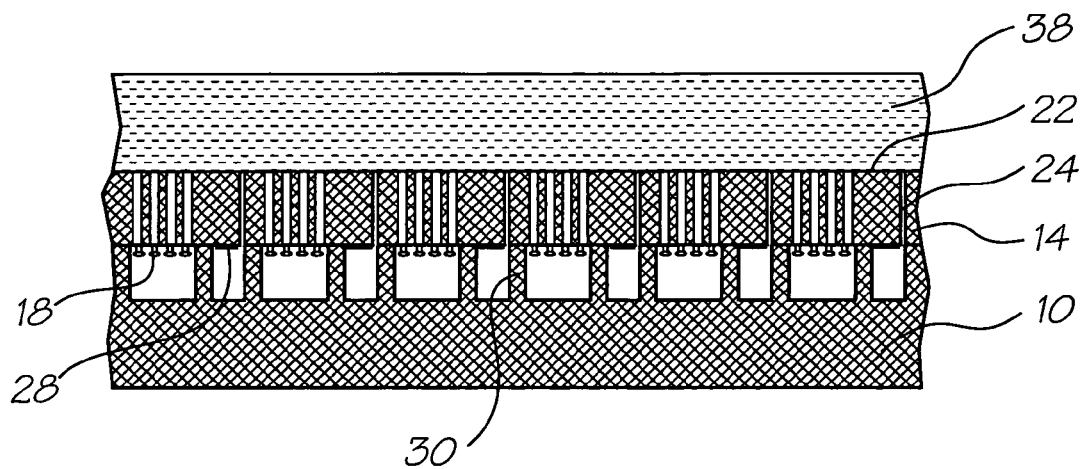
Figure 6:
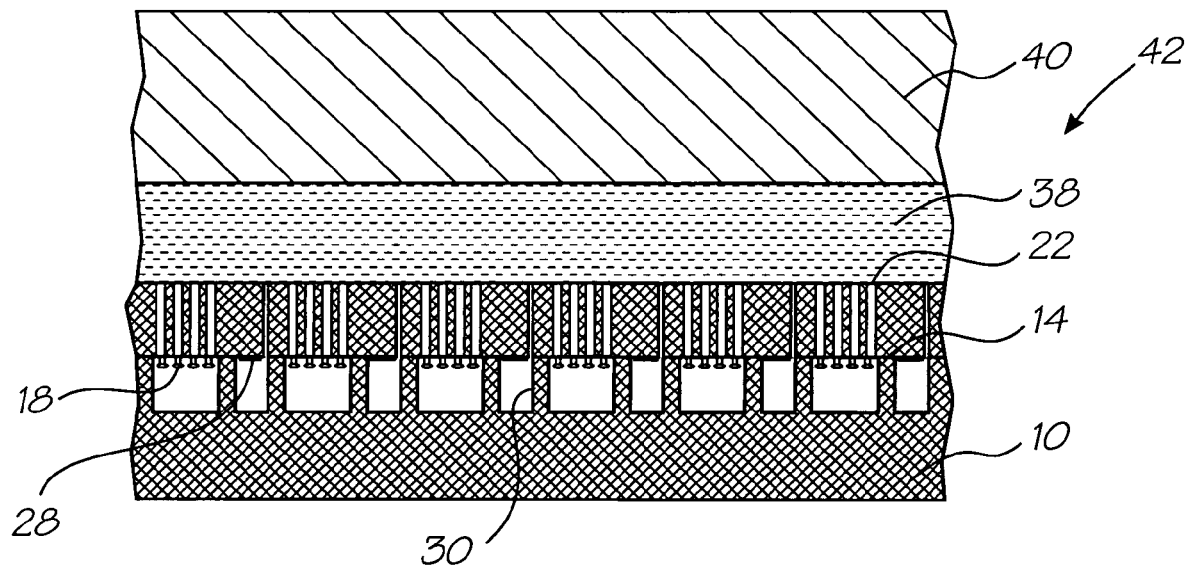

A holding means in the form of an adhesive tape 38 is bonded to the surface 22 of the layer 14 as illustrated in FIG. 5 of the drawings. The tape 38 is bonded to the layer 14 by means of a curable adhesive. The adhesive is curable in the sense that it loses its adhesive properties or "tackiness" when exposed to ultraviolet (UV) light.

Depending on the equipment used, a handling means in the form of a glass, quartz, alumina or other transparent handle wafer 40 is secured to an opposite surface of the tape 38.

Figure 7:
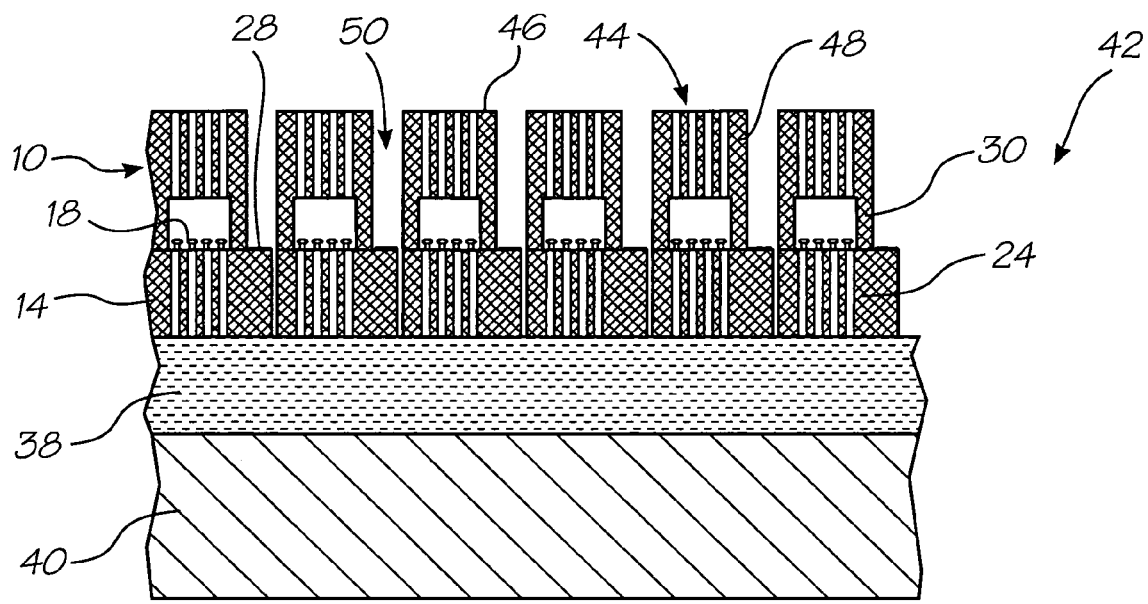

The wafer 40, the tape 38, the silicon wafer 14 and the nozzle guard layer 10 define a laminate 42. The laminate 42 is then turned over, as shown in FIG. 7 of the drawings.

Predetermined operations are carried out on the layer 10. More particularly, passages 44 are etched through the layer 10 from an outer surface 46 towards the chambers 36. In addition, individual nozzle guards 48 are formed by etching to remove material as shown at 50 in FIG. 7 of the drawings. The removal of this material exposes the bond pads 28 of each chip 20. Upon completion of this operation, the individual chips 20 are formed.

In this embodiment of the invention, each chip 20 has a plurality of MEMS elements 18 in an array formed thereon.

The laminate 42 is placed on an xy wafer stage (not shown) which is reciprocated, as illustrated by arrow 52 in FIG. 8 of the drawings. Each MEMS chip 20, when it is desired to remove it, is exposed to UV light as indicated by arrows 54 through a mask 56. This cures the adhesive of the tape 40 locally in a region beneath one particular MEMS chip 20 at a time to enable that MEMS chip 20 to be removed from the tape 38. The MEMS chip 20 is removed from the tape 38 by means of a transporting means including a vacuum pickup 58.

Hence, it is an advantage of the invention, that a method of fabrication is provided which facilitates the performing of various operations to fabricate the individual MEMS chip 20 and which facilitates removal of the MEMS chips 20 for packaging. It will be appreciated that devices of the kind in question are measured in micron dimensions. Accordingly, the MEMS elements 18 on such devices are extremely fragile. The provision of the nozzle guard layer 10 and the use of the UV curable tape 38 facilitates that the MEMS elements 18 are not touched by solids or liquids after they are released by the release etch.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A method of fabricating printheads each having a plurality of nozzle assemblies positioned on a substrate from a plurality of sets of the nozzle assemblies positioned on the substrate, the method comprising the steps of:
   applying a guard defining a plurality of recesses to the substrate so that each set is located within a respective recess;
   segmenting the substrate into discrete parts;
   bonding an adhesive layer to a back side of the substrate, the adhesive layer being curable in the presence of ultraviolet light;
   segmenting the guard into discrete parts corresponding to the discrete parts of the substrate thereby forming individual printheads; and
   selectively exposing the adhesive layer to ultraviolet light allowing removal of individual printheads.

2. A method as claimed in claim 1, further including the step of applying a handling layer to the adhesive layer so that the adhesive layer is located between the handling layer and the substrate.

3. A method as claimed in claim 1, including the further step of etching a plurality of ink ejection channels in the guard so that each ink ejection channel is in register with a respective nozzle assembly.

4. A method as claimed in claim 1, wherein the step of segmenting the substrate comprises the step of etching the substrate from the back side of the substrate prior to bonding the adhesive layer to the back side of the substrate.

5. A method as claimed in claim 4, comprising the further step of etching a plurality of ink supply channels in the back side of the substrate prior to bonding the adhesive layer to the back side of the substrate so that each nozzle assembly is in fluid communication with a respective ink supply channel.

* * * * *